United States Patent
Koizumi et al.

(10) Patent No.: US 9,115,031 B2
(45) Date of Patent: Aug. 25, 2015

(54) CERAMIC, AND PIEZOELECTRIC/ELECTROSTRICTION ELEMENT

(75) Inventors: Takaaki Koizumi, Taijimi (JP); Takuya Katsuno, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 219 days.

(21) Appl. No.: 13/042,778

(22) Filed: Mar. 8, 2011

(65) Prior Publication Data

US 2011/0241493 A1 Oct. 6, 2011

(30) Foreign Application Priority Data

Mar. 30, 2010 (JP) ................................. 2010-076900

(51) Int. Cl.
| | |
|---|---|
| *H01L 41/187* | (2006.01) |
| *C04B 35/49* | (2006.01) |
| *C04B 35/491* | (2006.01) |
| *C04B 35/622* | (2006.01) |
| *H01L 41/253* | (2013.01) |
| *H01L 41/314* | (2013.01) |

(52) U.S. Cl.
CPC ......... *C04B 35/491* (2013.01); *C04B 35/62222* (2013.01); *H01L 41/1876* (2013.01); *H01L 41/253* (2013.01); *H01L 41/314* (2013.01); *C04B 2235/3203* (2013.01); *C04B 2235/3251* (2013.01); *C04B 2235/3279* (2013.01); *C04B 2235/3298* (2013.01); *C04B 2235/3409* (2013.01); *C04B 2235/445* (2013.01); *C04B 2235/662* (2013.01); *C04B 2235/768* (2013.01); *C04B 2235/787* (2013.01)

(58) Field of Classification Search
CPC ... C03B 5/00; H01L 41/1875; H01L 41/1876; C04B 35/491
USPC ....................................... 252/62.9 R, 62.9 PZ
See application file for complete search history.

(56) References Cited

U.S. PATENT DOCUMENTS

| | | | |
|---|---|---|---|
| 6,097,133 A | 8/2000 | Shimada et al. | |
| 6,239,457 B1 * | 5/2001 | Suenaga et al. | 257/295 |
| 7,312,558 B2 * | 12/2007 | Fujii et al. | 310/358 |
| 7,785,659 B2 * | 8/2010 | Nihei | 427/100 |
| 8,237,338 B2 * | 8/2012 | Koizumi et al. | 310/358 |
| 2009/0185971 A1 | 7/2009 | Yokoyama et al. | |
| 2009/0189489 A1 | 7/2009 | Yura et al. | |
| 2010/0071179 A1 | 3/2010 | Koizumi et al. | |
| 2011/0012049 A1 | 1/2011 | Koizumi et al. | |
| 2011/0014362 A1 | 1/2011 | Koizumi et al. | |

FOREIGN PATENT DOCUMENTS

| | | |
|---|---|---|
| EP | 1 972 604 A1 | 9/2008 |
| EP | 1 972 606 A1 | 9/2008 |
| JP | S54-003298 | 1/1979 |
| JP | H09-221393 | 8/1997 |
| JP | 2001-261435 A1 | 9/2001 |
| JP | 2006-199580 | 8/2006 |
| JP | 2009-203105 | 9/2009 |

OTHER PUBLICATIONS

Hayashi. Low-temperature fabrication of Pb(Ni1/3Nb2/3)O3-Pb(Zr0.3Ti0.7)O3 ceramics with LiBiO2 as a sintering aid. Journal of the European Ceramic Society 24 (2004) 1037-1039.*
Japanese Office Action, Japanese Publication No. 2010-076900, dated Oct. 8, 2013 (3 pages).

* cited by examiner

*Primary Examiner* — Matthew E Hoban
(74) *Attorney, Agent, or Firm* — Burr & Brown, PLLC

(57) ABSTRACT

A ceramic having a plurality of crystal grains that contain lead, lithium, and boron, are arranged in a planar direction, and have a mutually same crystal orientation with respect to the thickness direction.

4 Claims, 4 Drawing Sheets

CERAMIC, AND PIEZOELECTRIC/ELECTROSTRICTION ELEMENT

CROSS-REFERENCE TO RELATED APPLICATIONS

This application claims priority under 35 U.S.C. §119 to Japanese Patent Application No. 2010-76900 filed on Mar. 30, 2010. The entire disclosure of Japanese Patent Application No. 2010-76900 is hereby incorporated herein by reference.

BACKGROUND OF THE INVENTION

1. Technical Field

The technical field relates to a new ceramic and a piezoelectric or electrostriction element using the ceramic.

2. Description of the Related Art

Patent Literature 1 (Japanese Patent Application Laid-Open No. 2001-261435) discloses a method of manufacturing a BNT piezoelectric body including a mixing step for mixing a plate-like $Bi_4Ti_3O_{12}$ grains, a perovskite-forming raw material that produces a perovskite-type compound expressed by $x(Bi_{0.5}Na_{0.5}TiO_3)-(1-x)ABO_3$ (wherein $0.1 \leq x \leq 1$) by reacting with the plate-like grains, and a Bi-containing raw material including Bi at least in 0.5% excess of the stoichiometric mixture ratio for Bi contained in the perovskite compound. This method of manufacture is further provided with a shaping step in which the mixture obtained in the mixing step is shaped so that plate-like grains become oriented, and a heat processing step in which the shaped body obtained in the shaping step is heated. Patent Literature 1 is directed to manufacture a high-density BNT piezoelectric body by use of this method which employs a reactive template grain growth method.

Patent Literature 2 (European Patent Application Laid-Open No. 1972606) discloses the manufacture of a crystallographically-oriented ceramic using a PZT sheet having a preset orientation as a template.

SUMMARY OF THE INVENTION

Plate-like grains having a large aspect ratio and similar composition, such as $Bi_4Ti_3O_{12}$ (termed BIT) in relation to the BNT-type piezoelectric body used in Patent Literature 1 cannot be obtained in a lead-based ceramic such as PZT or the like. Thus there are difficulties associated with obtaining a ceramic having high level of crystal orientation by application of an RTGG method to the structure of a lead-based ceramic.

In recent years, in order to increase the field intensity, or in order to respond to the demand for downsizing of constitutive elements, there has been a demand to form the piezoelectric body as a thin layer and form the electrodes as a thin layer. However when there is a difference in the heat resistance between the electrodes and the piezoelectric body, and in particular when the electrodes have low resistance to heat, if the thin-layer electrodes and the piezoelectric body are sintered at the same time, there is the possibility that electrical conductivity will not be obtained due to the formation of a disconnection in the electrodes. Thus there is a need for a piezoelectric body that can be sintered at a lower temperature.

The present invention is proposed in light of the outstanding problems above and has the object of providing a ceramic including lead that can be sintered at a low temperature.

The ceramic according to a first aspect of the present invention is provided with a plurality of crystal grains that contain lead, lithium, and boron, are arranged in a planar direction (a first direction), and have the same crystal orientation with respect to the thickness direction (a second direction perpendicular to the first direction).

In at least a portion of the ceramic, the number of crystal grains disposed with respect to the thickness direction may be one.

This ceramic may be used in a piezoelectric or electrostriction element including the ceramic and a pair of electrodes electrically connected with the ceramic. The thickness of the electrode may be less than or equal to 1 µm. The electrode may include silver or gold as a principal component, or may be a platinum or palladium plating film or sputtering film.

BRIEF DESCRIPTION OF DRAWINGS

FIG. 2A to FIG. 2C are figures showing a first aspect of a template layer preparation step in which FIG. 2A shows a grain layer formation process, FIG. 2B shows a fixing process, FIG. 2C shows a fixed grain body after the fixing process.

FIG. 3A to FIG. 3C are figures showing a second aspect of the template layer preparation step in which FIG. 3A shows the grain layer formation process and the fixing process, FIG. 3B shows a re-polymerizing process, and FIG. 3C shows the fixed grain body.

FIG. 4A to FIG. 4E are figures showing a third aspect of the template layer preparation step in which FIG. 4A shows an electrodeposition material formation process, FIG. 4B shows a drying process for the electrodeposition material 52, FIG. 4C shows a grain layer formation process, FIG. 4D shows a fixing process, and FIG. 4E shows a fixed grain body.

Figure 1:
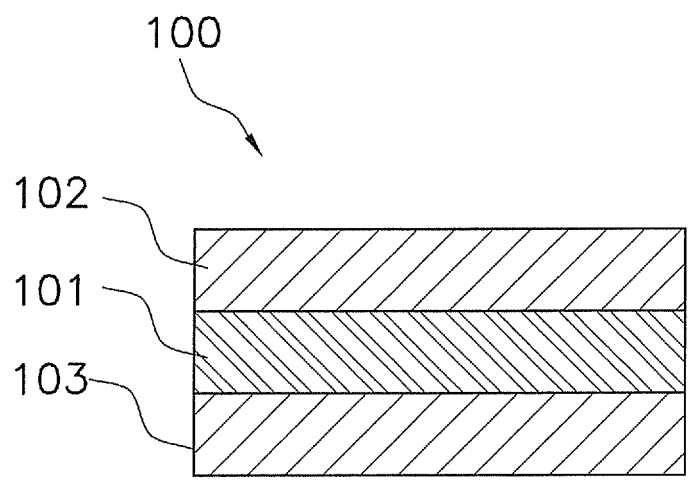
FIG. 1 is a sectional figure of a piezoelectric element according to an embodiment
Figure 1:
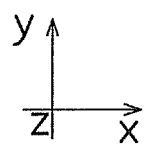

DETAILED DESCRIPTION OF THE INVENTION (1. Ceramic)

The ceramic according to an embodiment is provided with a plurality of crystal grains that contain lead, lithium, and boron, are arranged in a planar direction, and have a mutually same crystal orientation with respect to the thickness direction (the direction that is vertical with respect to the planar direction). In other words, the ceramic according to the present aspect is a crystallographically-oriented ceramic, and more specifically, a plurality of crystal grains has the mutually same crystal orientation with respect to an in-plane thickness. The crystal grains are disposed in proximity through a grain boundary.

However the ceramic may include crystal grains having a different crystal orientation. More specifically, the proportion of crystal grains having the same crystal orientation in the ceramic is preferably 80 volume % or more, and more preferably 90 volume % or more.

The ceramic may be described by the provision of a layer configured by crystal grains. In a single layer, a plurality of crystal grains are arranged in a planar direction, and one crystal grain is disposed in the thickness direction. It is preferred that the requirement for thin film formation is satisfied by at least a portion of the ceramic 1 having a single layer structure. It is preferred that the whole of the ceramic 1 has a single layer structure. However the ceramic may be provided with two or more laminated layers with respect to the thickness direction of the ceramic. In other words, two or more crystal grains in the ceramic may be superimposed with respect to the thickness direction. Although it is preferred that the number of crystal grains in the thickness direction in the overall ceramic is uniform, the number of crystal grains in the thickness direction may vary at different positions within the ceramic.

Various known materials for composing piezoelectric bodies, electrostriction bodies, or crystallographically-oriented ceramics may be used as the material configuring the ceramic. More specifically, in addition to lead, the ceramic may include titanium (Ti), zirconium (Zr), magnesium (Mg), niobium (Nb), nickel (Ni), sodium (Na), and/or barium (Ba). More specifically, the ceramic may include as a principal component at least one substance selected from the group consisting of $Pb(Zr, Ti)O_3$, $Pb(Mg, Nb)(Zr, Ti)O_3$, $Pb(Ni, Nb)(Zr, Ti)O_3$, $Pb(Zn, Nb)(Zr, Ti)O_3$, $Pb(Yb, Nb)(Zr, Ti)O_3$, $(Pb, Sr)(Zr, Ti)O_3$, $(Pb, Ba)(Zr, Ti)O_3$, $(Pb, La)(Zr, Ti)O_3$, $(Bi, Pb)(Ni, Nb)(Zr, Ti)O_3$, $(Bi, Pb)(Mg, Nb)(Zr, Ti)O_3$, $(Bi, Pb)(Zn, Nb)(Zr, Ti)O_3$, $(Pb, Sr, La)(Mg, Ni, Nb)(Zr, Ti)O_3$, $PbTiO_3$, $Pb(Mg, Nb)TiO_3$, $Pb(Ni, Nb)TiO_3$, and $Pb(Zn, Nb)TiO_3$.

In the present specification, "includes as a principal component" means that a certain composition preferably comprises at least 70 wt. %, more preferably at least 80 wt. %, and still more preferably at least 90 wt. % of a specific substance.

The presence of boron was can be confirmed using an electron probe microanalyser (EPMA). The presence of lithium can be confirmed using a chemical assay, a secondary ionization mass spectrometer (SIMS) or glow discharge optical emission spectroscopy (GD-OES). There is no particular limitation on the concentration of boron or lithium, and such concentration may vary in response to the initial concentration during manufacture or in a manufacturing step.

(2. Piezoelectric Element)

A piezoelectric element according to an embodiment will be described making reference to FIG. 1.

As shown in FIG. 1, a piezoelectric element 100 includes a piezoelectric body 101, and an upper electrode 102 and lower electrode 103 provided on both sides of the piezoelectric element 100. The ceramic described above in 1. is suitable for use as the piezoelectric body 101. A distortion is produced in the piezoelectric body 101 by a voltage applied from a power source (not shown) between the upper electrode 102 and the lower electrode 103 by electrically connecting the upper electrode 102 and the lower electrode 103 with the piezoelectric body 101. The piezoelectric body 101 can convert a pressure applied to the piezoelectric body 101 into a voltage. The piezoelectric element 100 may also be used as an electrostriction element. In other words, the ceramic above can be used as an electrostriction body.

A known conductive material may be used as the upper electrode 102 and the lower electrode 103. In particular, since the above ceramic can be sintered at a relatively low temperature, at least one of the following (1) or (2) can be applied to the upper electrode 102 and/or the lower electrode 103.

(1) use of a material having low heat resistance as the principal component;

(2) reduction of the film thickness of the electrode (for example a thickness of 1 μm or less).

The material having low heat resistance may be a material having a low melting point, for example, silver or gold.

Furthermore although platinum and palladium have a high melting point, since the coverage of these materials can be reduced by grain growth caused by heating processing, the resistance of these materials to high-temperatures is not high. However since the above ceramic can have an orientation due to sintering under a relatively low temperature, use of plating films or sputtering films of these materials is possible in relation to the electrodes of piezoelectric elements.

The piezoelectric element 100 for example can be used in an apparatus such as an inkjet head, a speaker, a pressure sensor, or the like.

(3. Method of Manufacturing Ceramic)

An aspect of a method of manufacturing the ceramic will be described referring to FIG. 2 to FIG. 4. This method of manufacturing can be applied to the manufacture of the above ceramic. However there is no limitation on the method of manufacturing the above ceramic, and the object for manufacture by this method of manufacture is not limited to the above ceramic.

The method includes the following steps (1) to (3).

(1) A template layer preparation step for preparing a template layer in which the crystal orientation is arranged in a predetermined direction;

(2) A matrix formation step in which a matrix is formed by disposing a mixed material on the template layer, the mixed material being a mixture of a material including lead and an additive material including lithium and boron; and (3) A sintering step in which the matrix and the template layer are sintered at a predetermined sintering temperature.

Each step will be described below.

(1) Template Layer Preparation Step

This step prepares the template layer in which the crystal orientation is arranged in a predetermined direction. "The crystal orientation is arranged in a predetermined direction" includes a state in which all the crystal orientation (for example (100) plane or the like) is arranged in a predetermined direction, a state in which a certain proportion, for example 60% or more, 80% or more of the total, of the crystal orientation is arranged in a predetermined direction, or the like.

The template layer 19 includes a fixing compound that is fixed to a substrate 12 due to heat or a potential difference. The method of forming the template layer 19 includes the method shown in FIG. 2A to FIG. 2C, and the method in FIG. 3A to FIG. 3C, and FIG. 4A to FIG. 4D.

(1-1) First Aspect of Template Preparation Layer Step

A first aspect of the template preparation layer step will be described making reference to FIG. 2A to FIG. 2C. In the present aspect, a template layer 19 is prepared by fixing template grains 14 configured from a material containing lead onto a substrate 12. More specifically, the method includes a grain layer formation process, a fixing process, and a washing process.

Figure 2A:
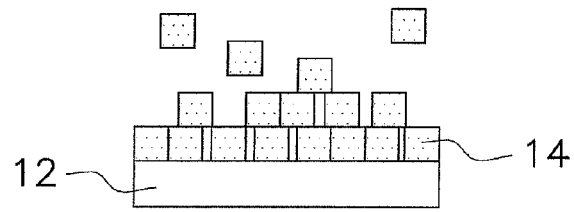

As shown in FIG. 2A, a layer configured by template grains 14 is formed on the substrate 12 in the grain layer formation process.

The template grains 14 may be disposed on the surface of the substrate 12. The substrate 12 for example includes at least one of glass, a monocrystal, a ceramic, a resin and a metal. The glass substrate includes for example quartz and non-alkali glass. The monocrystal substrate includes for example silicon, gallium arsenide, silicon carbonate, alumina, and strontium titanate. The ceramic substrate includes for example stabilized zirconium oxide, aluminum oxide, magnesium oxide, mullite, aluminum nitride, and silicon nitride. The resin substrate includes an epoxy resin or a polyester resin. The metal substrate includes stainless steel, aluminum, or platinum. An insulation resin may be coated on the metal. In the following description, a substrate 12 formed from platinum will be described.

The template grains 14 may be configured from a material containing lead. The template grains 14 for example may be prepared in advance to have a polyhedric shape. Preferably, the template grains 14 are cubic in shape. The cubic crystals of the material containing lead for example can be prepared by a hydrothermal synthesis method. For example, the material containing lead may use at least one substance selected from the group of substances given in (1) and (2) below.

(1) $Pb(Zr, Ti)O_3$, $Pb(Mg, Nb)(Zr, Ti)O_3$, $Pb(Ni, Nb)(Zr, Ti)O_3$, $Pb(Zn, Nb)(Zr, Ti)O_3$, $Pb(Yb, Nb)(Zr, Ti)O_3$, $(Pb, Sr)(Zr, Ti)O_3$, $(Pb, Ba)(Zr, Ti)O_3$, $(Pb, La)(Zr, Ti)O_3$, $(Bi, Pb)(Ni, Nb)(Zr, Ti)O_3$, $(Bi, Pb)(Mg, Nb)(Zr, Ti)O_3$, $(Bi, Pb)(Zn, Nb)(Zr, Ti)O_3$, $(Pb, Sr, La)(Mg, Ni, Nb)(Zr, Ti)O_3$, $PbTiO_3$, $Pb(Mg, Nb)TiO_3$, $Pb(Ni, Nb)TiO_3$, and $Pb(Zn, Nb)TiO_3$.

(2) A raw material formed from the above compositions after sintering (for example, the hydroxides, the oxides or the like of these substances).

Although there is no particular limitation on the size of the template grains 14 with reference to a specific value, the grains for example may have a size of 100 nm or more.

(Grain Layer Formation Process)

The grain layer formation process arranges the template grains on the substrate. There is no particular limitation on the specific details of the grain layer formation process as long as it is a method that supplies a formed grain layer to the subsequent fixing process. For example, as shown in FIG. 2A, the grain layer is formed without immersion of the substrate 12 in a solution. Furthermore in FIG. 2A, the grain layer is formed directly onto the substrate 12. This method of formation for example, may use one or more of a spray coating method, a spin-coat method, or a doctor blade method.

(Fixing Process)

Figure 2B:
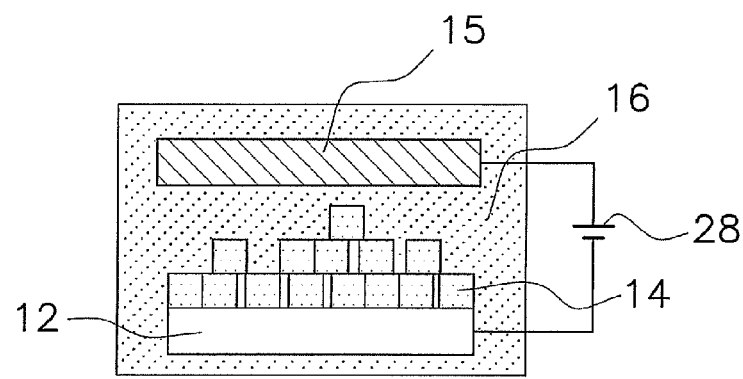

As shown in FIG. 2B, in the fixing process, the substrate 12 is immersed in a monomer solution 16 containing a chemical substance (monomer) that undergoes electropolymerization with a counter electrode 15 facing the substrate 12. The monomer undergoes electropolymerization on the substrate 12 due to the generation by the power source 28 of a potential difference between the substrate 12 and the counter electrode 15, and thereby forms a polymer. The polymer is shown as a resin 18 in the figure.

Figure 2C:
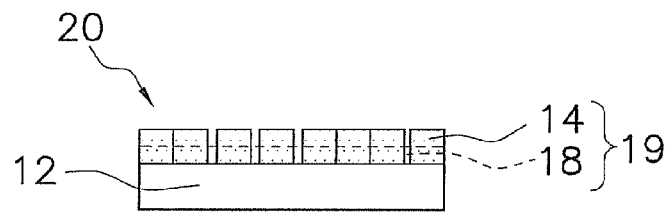

In this manner, as shown in FIG. 2C, the template layer 19 including the template grains 14 and the resin 18 is formed on the substrate 12. The resin 18 enters between the template grains 14 to thereby mechanically fix the template grains 14. Thus the template grains 14 are fixed more strongly to the substrate 12 than a method of simply arranging the template grains 14 on the substrate 12. In this manner, a fixed grain body 20 is obtained that includes a substrate 12 and a template layer 19.

The monomer solution 16 is a solution that contains one or more monomers that polymerize as a result of electropolymerization and are dissolved in a solvent and/or dispersed in a dispersion medium.

The monomer may be for example:
  a type of vinyl monomer such as styrene, N-vinylcarbazole, or the like;
  an aromatic compound such as aniline, phenol, or the like; and
  a heterocyclic compound such as pyrrole, thiofuran, furan, or the like.

The mechanism for electropolymerization depends on the type of monomer, but may include for example:
  a polymerization reaction mediated by radical cations or radical anions;
  a polymerization reaction caused by reactive species such reduced cations, anions and free radicals generated by oxidation or reduction of coexisting supporting electrolyte or added agents;
  chain polymerization; and
  step-growth polymerization.

The resin 18 after polymerization is the monomer polymer body described above. More specifically, the resin 18 includes polymer bodies of pyrrole-monomer such as pyrrole, alkylpyrrole, aminopyrrole, or the like, polymer bodies of aniline, or polymer bodies of thiofuran-monomer such as thiofuran, alkylthiofuran, thiofuran derivatives, or the like.

In particular use of a pyrrole aqueous solution is preferred from among the solutions of the above monomers due to ease of handling.

In order to induce electropolymerization, the monomer solution 16 may contain an oxidant such as an alkylbenzene sulfonate salt such as sodium p-toluenesulfonate, ethylbenzenesulfonic acid sodium, sodium dodecylbenzenesulfonate, or the like.

The electrical conditions including voltage and current and the processing time for the electropolymerization may be varied in response to the size of the template grains to be fixed, and the thickness and size of the target grain layer.

(Cleaning Process)

Excess template grains 14 on the substrate 12, that is to say, template grains 14 that are not fixed by the resin 18 produced by electropolymerization are removed by a cleaning process. The cleaning process is performed by running water washing, ultrasonic cleaning, or the like.

(1-2) Second Aspect of the Template Layer Preparation Step

Description which overlaps with the first aspect will not be repeated in the following description. In other words, materials and processing that are not described below adopt a configuration that is the same as the first aspect.

(Grain Layer Formation Process and Fixing Process)

The grain layer may be formed by immersing the substrate 12 in a solution (slurry) containing the template grains 14. This type of method for example may include one, or a combination of two or more of the following methods:
  a method of sedimentation of the template grains 14 in the slurry by immersing and holding stationary the substrate 12 in the slurry that contains a dispersal of the template grains 14;
  an LB method in which the template grains 14 are arranged in a liquid phase interface, and the substrate that is immersed in a lower phase is raised;
  a method of electrophoresis; and
  a dipping method.

The slurry may include the above mentioned monomer that undergoes electric field polymerization.

When forming the grain layer, the grains may be disposed more densely on the substrate 12 by application of mechanical vibration, sound waves, heat, light or magnetic fields.

Since the grain layer is immersed in a solution in the fixing process, a drying process and/or heating process may be performed after formation of the grain layer to thereby impart strength to the grain layer.

Figure 3A:
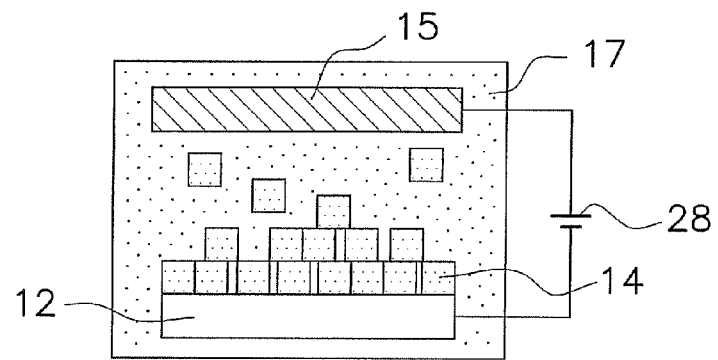

FIG. 3A shows a method of sedimentation of the template grains 14 by immersion of the substrate 12 in the slurry. This method can be performed at the same time as the fixing process (electropolymerization of the fixing compound monomer), and even when performed after the fixing process, there is the advantage that transition of processing can be executed smoothly.

As shown in FIG. 3A, the substrate 12 is immersed in a slurry 17 including the template grains 14 and the monomer that undergoes electropolymerization contained in a reaction vessel. In the reaction vessel, a counter electrode 15 is disposed facing the substrate 12.

After forming the grain layer on the substrate 12, the monomer undergoes electropolymerization as a result of continued immersion of the substrate 12 in the slurry 17. Consequently the template grains 14 are fixed to the substrate 12 by the polymerized resin 18. As a result, a template layer 19 is formed.

The grain layer can also be formed on the substrate 12 by immersing and raising the substrate 12 in the slurry 17 in which the template grains 14 float in a membranous form on the surface of the liquid and the counter electrode 15 is opposed to the substrate 12 as shown in FIG. 3A. In this case, when the substrate 12 is raised, the monomer may undergo electropolymerization by creation of a potential difference between the substrate 12 and the counter electrode 15, and fix the grain layer with the polymerized resin 18. According to this process, the formation of the grain layer and the fixing of the template grains 14 can be executed at substantially the same time. As a result, a relatively thin grain layer is obtained.

(Re-Polymerization Process)

Figure 3B:
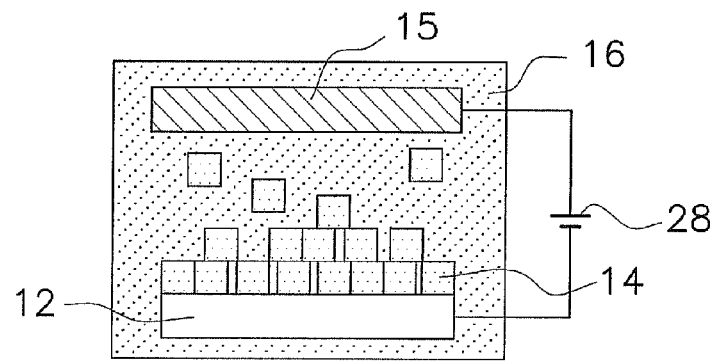

The template layer preparation step may include a re-polymerization process. As shown in FIG. 3B, in the re-polymerization process, after passing through the grain layer formation process and the fixing process, the substrate 12 is immersed in the monomer solution 16 described above that contains monomers and does not contain template grains 14. The monomer can be subjected to electropolymerization on a subsequent occasion by providing a potential difference between substrate 12 and the counter electrode 15.

Figure 3C:
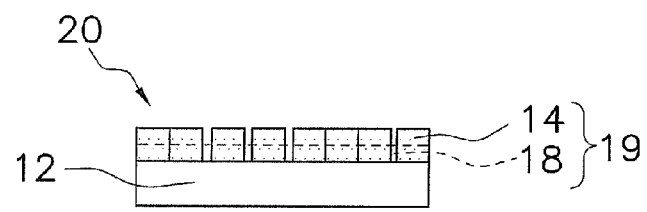

After passing through this process, the template layer 19 includes a further polymer body. As a result, elimination of template grains 14 from the uppermost layer is facilitated, and in other words, a template layer 19 is obtained in which the number of template grains 14 with respect to the thickness direction is one (FIG. 3C).

For example, in the fixing process (FIG. 3A), when template grains from a sub-micron size to several microns are fixed by a conductive polymer, a single layer of template grains 14 can be easily obtained by execution of a re-polymerization process (FIG. 3B) using a conductive monomer solution as the monomer solution 16.

The cleaning process above may be performed after the re-polymerization process, or may be performed before and after the re-polymerization process.

(1-3) Third Aspect of the Template Layer Preparation Step

Description which overlaps with the first aspect or the second aspect will not be repeated in the following description. In other words, materials and processing that are not described below adopts a configuration that is the same as the first aspect or the second aspect.

According to the methods shown in FIG. 4A to FIG. 4E, a fixed grain body 60 including a substrate 12 and template grains 14 fixed to the substrate 12 can be prepared by using a thermoplastic electrodeposition material as a fixing compound in the fixing process in substitution for a chemical substance that undergoes electropolymerization. This method includes an electrodeposition material layer formation process, a fixing process, and a cleaning process.

(Electrodeposition Material Layer Formation Process)

Figure 4A:
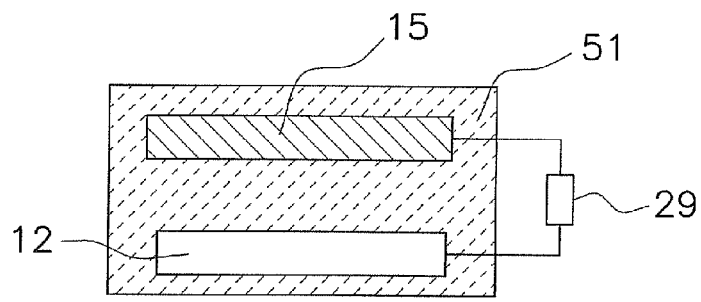
Figure 4B:
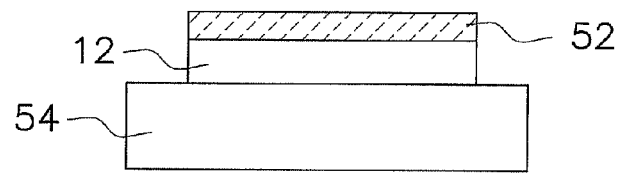

As shown in FIG. 4A, the electrodeposition material layer formation process forms an electrodeposition material layer 52 that is configured as a layer of a thermoplastic electrodeposition material on the substrate 12. In the electrodeposition material layer formation process, the substrate 12 is immersed in a thermoplastic electrodeposition material solution 51 that contains the thermoplastic electrodeposition material in a situation where the counter electrode 15 faces the substrate 12. The electrodeposition material layer 52 that is configured as a layer of a thermoplastic electrodeposition material is formed by producing a potential difference between the substrate 12 and the counter electrode 15 with the power source 29 (FIG. 4B).

The thermoplastic electrodeposition material may include for example:
  a carbon-based polymer compound such as an epoxy resin, a polyimide resin, a polyimide-imide resin, and acrylic resin, or the like;
  a silicon-based polymer compound such as a silicon resin, or the like; and
  an oxide nanograin of alumina for example that has a dispersant adhered to a surface thereof and that has an electrostatic charge.

Furthermore the thermoplastic electrodeposition material may be in a cationic form in which the covering film component is positively charged or may be in an anionic form in which the covering film component is negatively charged. The potential on the substrate 12 is determined by whether the thermoplastic electrodeposition material is in a cationic form or in an anionic form.

The solvent or the dispersion medium for the thermoplastic electrodeposition material solution 51 for example includes an inorganic solvent such as water or the like, or an organic solvent such as alcohol, or the like. More specifically, the thermoplastic electrodeposition material solution 51 may be a water-based electrodeposition coating material. The water-based electrodeposition coating material is preferably used due to simplicity of handling.

The thermoplastic electrodeposition material solution 51 may include a catalyst such as a tin compound or a hardening agent such as a blocking isocyanate, or the like.

As shown in FIG. 4B, the electrodeposition material layer 52 may be dried using a heater 54, or the like.

(Grain Layer Formation Process)

Figure 4C:
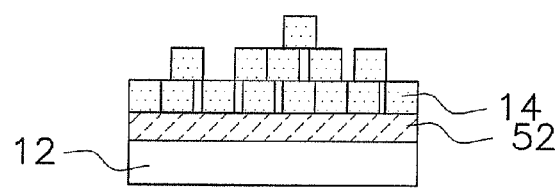

As shown in FIG. 4C, the grain layer formation process disposes the template grains 14 on the electrodeposition material layer 52. Since the method of disposition of the template grains 14 has already been described, detailed description will not be repeated.

(Fixing Process)

Figure 4D:
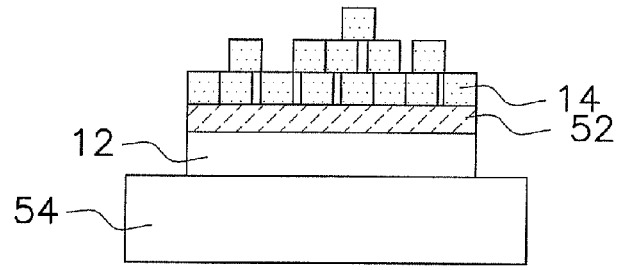
Figure 4E:
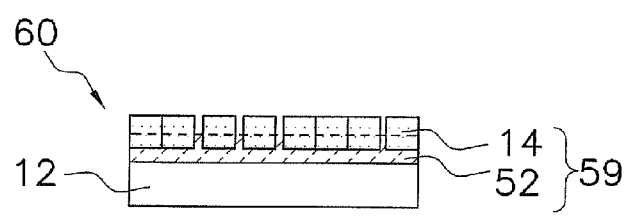

Next, the template grains 14 are fixed by the electrodeposition material layer 52 onto the substrate 12 by heating the electrodeposition material layer 52 to thereby form the template layer 59. In FIG. 4D, the thermoplastic electrodeposition material in the electrodeposition material layer 52 is heated to a melting temperature by the heater 54. In FIG. 4D, the heater 54 is disposed so that the substrate 12 is interposed between the heater 54 and the electrodeposition material layer 52.

The fixing process may be executed by inserting the substrate 12 into an oven or the like and heating, or by irradiating electromagnetic waves onto the electrodeposition material layer 52.

The thermoplastic electrodeposition material enters between the template grains 14 as a result of the heating of the thermoplastic electrodeposition material, and thus mechanically fixes the template grains 14 in the template layer 59 onto the substrate 12 as a result of the thermoplastic electrodeposition material entering between the template grains 14.

Needless to say, the cleaning process may also be executed in this aspect.

(1-4) Combination

As described above, the template layer preparation step according to the first to the third aspects includes a plurality of processes. The items described as processes or as elements of the different aspects may be mutually combined.

(2) Matrix Formation Step

Figure 2D:
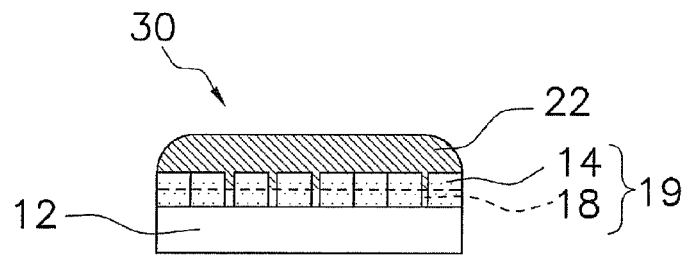
FIG. 2D shows a shaped body after a matrix formation process.

The matrix formation step disposes a matrix material on the template layer. In this manner, for example, in the fixed grain body 20 as shown in FIG. 2C, a matrix 22 is formed on the template layer 19 as shown in FIG. 2D. A shaped body 30 is prepared in this manner. All of the template layer preparation steps described above can be respectively combined with the matrix formation step or any subsequent step.

The matrix material may be a mixture of an additive material including lithium or boron and a material containing lead.

There is no particular limitation on the additive material to a specific composition and it may be any material that adds lithium and boron to the matrix. The additive material that contains lithium and boron for example includes at least one compound selected from the group consisting of $LiBO_2$, $LiB_4O_7$, $LiB(OH)_4$, $Li_3BO_3$, $Li_6B_4O_9$, $LiB_3O_5$, and $Li_2B_8O_{13}$. Furthermore lithium may be contained in at least one additive material of $Li_2CO_3$ and LiF.

The added amount of the additive material is preferably in the range of at least 0.05 wt. % to 10 wt. % or less of the overall matrix. When the added amount is 0.05 wt. % or more, a larger orientation effect is obtained. When the added amount is 10 wt. % or less, an effect is obtained that the residual amount after sintering is not excessive.

The material containing lead may be a material described in relation to the material for the template grain. The material containing lead may be suitably selected in response to the composition or the like of the template grains 14 described above, or the target composition.

The method of provision of the matrix material for example may include one, or a combination of two or more of the following methods:
  a method of coating by spraying;
  a method of spin-coating;
  a doctor-blade method; and
  a dipping method.

(3) Sintering Step

The sintering step sinters the resulting shaped body at a predetermined sintering temperature, removes the resin 18 and forms the template layer 19 and the matrix 22 into a piezoelectric body. In other words, this step forms a crystallographically-oriented ceramic.

The sintering temperature is set in response to the composition of the target ceramic. The sintering temperature is set for example at 1100° C. or less, and preferably to 1000° C. or less. The sintering temperature is preferably set to 900° C. or more. The temperature required for orientation of the crystals is suppressed to a lower temperature by the additive material including lithium and boron.

The sintering atmosphere is not limited to a particular gas and may be an atmosphere of atmospheric air.

During the sintering step, the action of the additive material causes crystal growth in the matrix 22 in a crystal orientation that is arranged in a predetermined direction of the template layer 19. Thus a ceramic can be manufactured with superior orientation in which the crystal orientation is arranged in a predetermined direction by sintering of the substrate 12 which forms the template layer 19 and the matrix 22 on a surface thereof. The reason that such an effect is obtained is conjectured to be due to the action of the additive material that includes lithium and boron in facilitating the growth of the material containing lead into a polyhedral shape.

Since lithium and boron are vaporized by sintering, the lithium and boron content amount (concentration) in the sintered body may be lower than the shaped body before sintering.

(4) Post-Annealing Step

The method of manufacturing the ceramic may include a post-annealing step. The post-annealing step heats the sintered body (ceramic) obtained after the sintering step. In this step, the amount of the additive material contained in the ceramic is reduced.

The post-annealing step for example may be executed under the same conditions of temperature, retaining time and atmospheric conditions as the conditions for the sintering step. Furthermore the post-annealing step for example may include one or a combination of the following methods:
  long-term retention at a temperature lower than the conditions for the sintering step, for example a temperature of at least 700° C. and 1000° C. or less; or
  heating in an atmosphere in which the partial pressure of oxygen adjusted to a pressure in which the additive material tends to vaporize.

(5) Other Aspects

The present invention is not limited to the aspects described above, and various modifications may be added within a scope that does not depart from the spirit of the present invention. For example, the above aspects may be modified in the following manner.

(5-1)

In the above aspects, an electrically conductive material was used as the substrate 12. Thus the substrate 12 can be used as an electrode in the fixing process. For that reason, the template grains 14 can be directly disposed on the substrate 12. Furthermore the substrate 12 can be used as a driving electrode for the piezoelectric body.

A substrate 12 having surfaces with insulation characteristics may be used, an electrically conductive electrode may be disposed on the substrate 12, and the template grain 14 may be disposed on the electrode. In this manner, the electrode that is used for fixing the template grains 14 can be used as a driving electrode for the piezoelectric body without further modification. The material used in the electrode for example may be at least one type selected from the group consisting of:
  platinum, palladium, ruthenium, gold, and silver;
  alloys thereof; and
  conductive polymers.

Furthermore the pattern method for the electrodes for example may be any of vapor deposition, sputtering, screen printing, electroless plating, or interfacial polymerization of monomers. A region on the electrode not provided with template grains 14 may be masked.

(5-2)

A step in which template grains 14 are oriented on the substrate 12 in order to prepare template layer in which the crystal orientation is arranged in a predetermined direction has already been described as a template layer preparation step.

In addition, the template layer preparation step may prepare a substrate in which the crystal orientation is arranged in a predetermined direction. When using this substrate, there is no need to provide template grains on the substrate. In other words, the substrate itself functions as the template.

A monocrystal substrate in which the crystal orientation is arranged in a predetermined direction may be used as the substrate in which the crystal orientation is arranged in a predetermined direction. The monocrystal substrate may be for example, silicon, gallium arsenide, silicon carbonate, alumina, and strontium titanate, magnesium oxide, calcium fluoride, lithium niobate, lithium tantalate, potassium tantalate, cerium oxide, and the like.

A deposition film of platinum, titanium, strontium ruthenate, lanthanum nickelate, yttria stabilized zirconia, cerium oxide, and the like may be formed on the monocrystal substrate as a lower electrode or as a buffer layer that mitigates the lattice constant difference.

In this manner, when the substrate itself acts as a template, the matrix may be directly formed on the surface of the substrate in the matrix formation step.

Furthermore at least one of the template layer and the matrix may be pre-formed as a sheet. For example, a template sheet may be prepared by aligning the template grains 14 in which the crystal orientation is arranged in a predetermined direction, and forming into a sheet shape. A matrix sheet may be prepared by forming a mixed material that is a mixture of a material including lead and an additive material including lithium and boron into a sheet shape. A crystallographically-oriented ceramic may be manufactured by preparing a laminated body in which the template sheet and the matrix sheet are laminated alternately, and sintering the laminated body.

After preparing ceramic sheets by sintering the template layer and the matrix together, a matrix laminated body may be manufactured by adhering these ceramic sheets together.

The method of manufacture described above was a RGTT method (reactive template grain growth method). However as described above, there is no limitation on the method of manufacturing the ceramic.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

EXAMPLES

Examples of the present invention will be described in detail below. However these examples do not limit the invention.

Examples 1-2

1. Preparation of Samples 1-1 Template Layer Preparation Step
i) Preparation of Template Grains Platinum was plated with a thickness of 0.5 μm onto a 10 mm×10 mm zirconium base plate having a thickness of 0.5 mm, and used as a substrate.

The raw material for the template layer uses a lead aqueous solution including lead acetate trihydrate (Kanto Kagaku Co., Inc.), ethylenediaminetetraacetic acid (Kanto Kagaku Co., Inc.), and potassium hydroxide (Kanto Kagaku Co., Inc.); an aqueous solution of zirconium containing zirconyl chloride octahydrate (Kanto Kagaku Co., Inc.); an aqueous solution of titanium chloride (Wako Pure Chemical Industries, Ltd.); and an aqueous solution of potassium hydroxide containing potassium hydroxide (Kanto Kagaku Co., Inc.). These raw materials were mixed in a molar ratio (ratio of numbers of atoms) of Pb:Zr:Ti=1.1:0.7:0.3 to prepare a raw material solution.

30 ml of the raw material solution was placed into a 100 ml SUS pressure vessel having inner walls of polytetrafluoroethylene, and subjected to hydrothermal synthesis for 4 hours at 165° C. to obtain lead zirconate titanate (hereafter PZT) grains having a cubic shape and a grain diameter of 2 μm. The grain diameter of the PZT grains is a median diameter (D50) measured using water as a dispersion medium with a dynamic scattering grain size distribution measuring apparatus Zetasizer Nano nano-ZS manufactured by Spectris Co., Ltd. The PZT grains were used as template grains in the following operation.

ii) Formation of Template Layer

Dodecylbenzenesulfonic acid sodium (Kanto Kagaku Co., Inc.) and pyrrole (Kanto Kagaku Co., Inc.) were added to 30 ml of pure water to have a concentration of 0.01 mol/L (liter) and thereby prepare a pyrrole aqueous solution. The pyrrole aqueous solution was placed in a beaker and 1 wt. % of the PZT grains was introduced into the pyrrole aqueous solution. Then a dispersing process was executed with a homogenizer to thereby prepare a turbid liquid (slurry).

Then the above base plate was placed on the bottom of the beaker holding the slurry, and held in a stationary position for 10 minutes until the PZT grains sediment and build up thereon.

Next, a SUS counter electrode was disposed with a 1-mm electrode interval to be parallel to the base plate and connected to a power source so that the base plate is the negative pole and the counter electrode is the positive pole. A polypyrrole was formed on the base plate by applying a 2 Hz triangular wave at a peak voltage of 5V on 30 occasions between the base plate and the counter electrode.

Excess PZT grains were removed by rocking the base plate having the polypyrrole deposition film in the aqueous solution. Thereafter ultrasonic cleaning in pure water was executed to thereby remove PZT grains attached to portions other than the base plate. The ultrasonic cleaning was performed under conditions of 40 kHz and 1 minute using an ultrasonic cleaning apparatus (UT-106, Sharp Corporation).

The operation above obtained a base plate in which the planar direction of the PZT grains was fixed in a membranous direction on a platinum base plate arranged in a (100) direction.

1-2 Matrix Formation Step, Sintering Step

The raw material for the matrix (hereafter termed the "piezoelectric body material") was lead oxide (Mitsui Mining and Smelting Co., Ltd.), titanium oxide (Ishihara Sangyo Kaisha, Ltd.), zirconium oxide (Nippon Denko Co., Ltd.), niobium oxide (Mitsui Mining and Smelting Co., Ltd.), bismuth oxide (Taiyo Koko Co., Ltd.), and nickel oxide (Seido Chemical Industry Co., Ltd.). These raw materials were used in a known solid phase reaction method to prepare a composition of nickel bismuth niobate (Bi(Ni, Nb) $O_3$) and lead zirconate titanate (Pb(Zr, Ti) $O_3$) having a composition ratio of 2:8 (hereafter termed "20BNN-80PZT").

An additive material such as lithium fluoride (LiF), or lithium carbonate ($Li_2CO_3$) and lithium borate ($LiBO_2$ or $Li_2B_4O_7$) was added to 20BNN-80PZT in the concentration as shown in Table 1. Using acetone as a solvent, 20BNN-80PZT and the additive material were mixed for 24 hours in a polyethylene vessel.

The concentration shown in Table 1 is a weight percent related to the overall matrix, that is to say, relative to the total of 20BNN-80PZT and the additive material.

A powder was obtained by drying the mixed solution. A butyral binder (Sekisui Chemical Co., Ltd. BL-S), a dispersing agent (Kao Corporation SPO-30), a plasticizer (Kurogane Kasei Co., Ltd. DOP), and a dispersant (Katayama Chemical Ltd. terpineol) were added to the powder, to thereby obtain a PZT paste by kneading with a triroll mill.

The PZT paste was coated uniformly by spin-coating on the base plate with PZT grains arranged thereon. The rotation speed for spin-coating was 1000 rpm and the coating period was 30 seconds. The base plate after coating was placed onto a hotplate and dried at 90° C. for 5 minutes to thereby obtain a shaped body (FIG. 2D). This shaped body was subjected to degreasing for 2 hours at 500° C.

The rate of temperature increase was 200° C./h, and the shaped body after degreasing was sintered at 1000° C. for three hours. The atmosphere used during sintering was atmospheric air and after completion of sintering the rate of temperature decrease was 200° C./h.

A ceramic sample was obtained by the above operation.

2. Confirmation of the Presence of Boron and Lithium

The presence of boron was confirmed using an electron probe micro-analyzer (SPMA).

Furthermore the presence of lithium in the sintered body was confirmed by dissolving the ceramic sample in acid and subjecting to inductively coupled plasma (ICP) emission spectrographic analysis.

3. XRD

X-ray diffraction (XRD) was performed on the ceramic sample using an XRD apparatus (X-ray diffraction apparatus) (Pert MPD Pro, Spectris Co., Ltd.).

4. Durability

The change in electrical resistance was measured by applying a 1 Hz triangular wave at 0-30V voltage in 1 billion pulses to the ceramic sample. Ceramics which had a change of less than 2% were determined to have a durability of "good".

5. Dissipation Loss

Dissipation loss in the sample in Example 1 and the comparative example 1 as described below were measured using an impedance analyzer. Ceramic samples having a dissipation loss of less than 10% were determined to be satisfactory.

Comparative Example 1

A sintered body was obtained using the same operational method described in example 1 with the exception that an additive material was not used. In other words, 20BNN-80PZT was obtained as a paste using the same procedure as the first example and was coated onto a Pt base plate having template grains arranged thereon using a spin-coating method. Thereafter, a ceramic sample was obtained after passing through degreasing and sintering (sintering temperature of 1200° C.).

Comparative Example 2

A ceramic sample in Comparative Example 2 was prepared as described below using glass as an additive material. 20BNN-80PZT was obtained as a paste using the same procedure as the first example, glass was added as an additive material, and was coated onto a base plate having template grains arranged thereon using a spin-coating method. Thereafter, greasing was performed, and sintering was executed at a temperature of 1000° C. The conditions were the same as the first example with the exception that the additive material was different.

Results

The presence of lithium and boron was confirmed in the ceramic sample in Examples 1-21.

The results of XRD did not identify hetero-phase components in any of the Examples 1-21 (Table 1).

Although Examples 1-21 had good durability, in Comparative Example 2, good durability was not obtained. Furthermore in Examples 1-21, although hetero-phase components were not identified, a hetero-phase component was observed in Comparative Example 2.

Example 1 passed dissipative loss whereas Comparative Example 1 failed.

TABLE 1

| Sample | Added Agent | Durability | Hetero-phase |
|---|---|---|---|
| Example 1 | LiF 3% + $Li_2B_4O_7$ 1% | good | no |
| Example 2 | LiF 3% + $Li_2B_4O_7$ 3% | good | no |
| Example 3 | LiF 3% + $Li_2B_4O_7$ 6% | good | no |
| Example 4 | LiF 6% + $Li_2B_4O_7$ 1% | good | no |
| Example 5 | LiF 6% + $Li_2B_4O_7$ 3% | good | no |
| Example 6 | LiF 6% + $Li_2B_4O_7$ 6% | good | no |
| Example 7 | LiF 1% + $Li_2B_4O_7$ 1% | good | no |
| Example 8 | LiF 1% + $Li_2B_4O_7$ 3% | good | no |
| Example 9 | LiF 1% + $Li_2B_4O_7$ 6% | good | no |
| Example 10 | $Li_2CO_3$ 1% + $LiBO_2$ 0.1% | good | no |
| Example 11 | $Li_2CO_3$ 1% + $LiBO_2$ 1% | good | no |
| Example 12 | $Li_2CO_3$ 1% + $LiBO_2$ 3% | good | no |
| Example 13 | $Li_2CO_3$ 1% + $LiBO_2$ 6% | good | no |
| Example 14 | $Li_2CO_3$ 3% + $LiBO_2$ 0.1% | good | no |
| Example 15 | $Li_2CO_3$ 3% + $LiBO_2$ 1% | good | no |
| Example 16 | $Li_2CO_3$ 3% + $LiBO_2$ 3% | good | no |
| Example 17 | $Li_2CO_3$ 3% + $LiBO_2$ 6% | good | no |
| Example 18 | $Li_2CO_3$ 6% + $LiBO_2$ 0.1% | good | no |
| Example 19 | $Li_2CO_3$ 6% + $LiBO_2$ 1% | good | no |
| Example 20 | $Li_2CO_3$ 6% + $LiBO_2$ 3% | good | no |
| Example 21 | $Li_2CO_3$ 6% + $LiBO_2$ 6% | good | no |
| Comparative Example 2 | Glass | poor | yes |

What is claimed is:

1. A ceramic layer comprising a plurality of crystal grains that contain lead, lithium, and boron, arranged in a planar direction, and having a mutually same crystal orientation with respect to a thickness direction of the layer, wherein a number of crystal grains disposed with respect to the thickness direction of the layer is one.

2. A piezoelectric or electrostriction element comprising a ceramic body comprising the ceramic layer according to claim 1 and a pair of electrodes electrically connected with the ceramic body.

3. The piezoelectric or electrostriction element according to claim 2, wherein the thickness of the electrode is less than or equal to 1 μm.

4. The piezoelectric or electrostriction element according to claim 2, wherein the electrode comprises silver or gold as a principal component, or comprises a platinum or palladium plating film or sputtering film.

* * * * *